United States Patent
Park et al.

(10) Patent No.: US 11,573,283 B1
(45) Date of Patent: Feb. 7, 2023

(54) SINGLE-SHOT PSEUDO-CENTRIC EPI METHOD FOR MAGNETIZATION-PREPARED IMAGING

(71) Applicant: KOREA ADVANCED INSTITUTE OF SCIENCE AND TECHNOLOGY, Daejeon (KR)

(72) Inventors: Sung-Hong Park, Daejeon (KR); Hyun-Soo Lee, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 0 days.

(21) Appl. No.: 17/380,604

(22) Filed: Jul. 20, 2021

(30) Foreign Application Priority Data

Jul. 6, 2021 (KR) .................. 10-2021-0088770

(51) Int. Cl.
*G01V 3/00* (2006.01)
*G01R 33/565* (2006.01)
*G01R 33/48* (2006.01)
*G01R 33/561* (2006.01)

(52) U.S. Cl.
CPC ..... *G01R 33/56545* (2013.01); *G01R 33/482* (2013.01); *G01R 33/5616* (2013.01)

(58) Field of Classification Search
CPC .............. G01R 33/543; G01R 33/5659; G01R 33/3415; G01R 33/36; A61B 5/055
USPC ........................................................ 324/309
See application file for complete search history.

(56) References Cited

U.S. PATENT DOCUMENTS

| 2004/0059213 A1* | 3/2004 | Kassai | G01R 33/5673 |
| | | | 600/410 |
| 2008/0303521 A1* | 12/2008 | Beatty | G01R 33/5611 |
| | | | 324/307 |
| 2014/0361770 A1* | 12/2014 | Dannels | G01R 33/34 |
| | | | 324/309 |

FOREIGN PATENT DOCUMENTS

| DE | 69734755 T2 * | 8/2006 | ....... G01R 33/56308 |
| JP | 2000023945 A * | 1/2000 | ............. A61B 5/055 |
| KR | 1020170024243 | 3/2017 | |
| WO | WO-2014186737 A1 * | 11/2014 | ............. A61B 5/055 |

* cited by examiner

*Primary Examiner* — Walter L Lindsay, Jr.
*Assistant Examiner* — Frederick Wenderoth
(74) *Attorney, Agent, or Firm* — Mayer & Williams, PC; Stuart H. Mayer

(57) ABSTRACT

Provided is a method for generating MRI data including applying, by an MRI computing device, an RF excitation pulse, and completing, by the MRI computing device, a K-space by acquiring a plurality of phase encoding line groups, in a state in which any other RF excitation pulse is not applied after applying the RF excitation pulse, in which each of the plurality of phase encoding line groups includes a plurality of phase encoding lines, and an absolute value of an average phase encoding size of a phase encoding line group acquired earlier is not greater than an absolute value of an average phase encoding size of a phase encoding line group acquired later, among the plurality of phase encoding line groups.

13 Claims, 15 Drawing Sheets

Fig. 4

| Sequence | N | Minimum TE (ms) | Readout Duration (ms) |
|---|---|---|---|
| GE-EPI (Linear) | – | 50.4 | 97.6 |
| GE-EPI (Centric) | 1 | 1.4 | 133.3 |
| | 2 | 1.4 | 115.4 |
| | 3 | 1.4 | 109.3 |
| | 4 | 1.4 | 106.4 |
| | 5 | 1.4 | 104.9 |
| | 6 | 1.4 | 103.3 |
| | 8 | 1.4 | 101.8 |
| | 12 | 1.4 | 100.2 |
| | 24 | 1.4 | 98.7 |

SINGLE-SHOT PSEUDO-CENTRIC EPI METHOD FOR MAGNETIZATION-PREPARED IMAGING

CROSS-REFERENCE TO RELATED APPLICATION

This application claims priority to Korean Patent Application No. 10-2021-0088770 filed on Jul. 6, 2021 and all the benefits accruing therefrom under 35 U.S.C. § 119, the contents of which are incorporated by reference in their entirety.

BACKGROUND

The present disclosure relates to magnetic resonance imaging (MRI), and to a single-shot centric-reordered EPI (1sh-CenEPI) technique capable of improving a signal-to-noise ratio (SNR) for magnetization-prepared imaging by significantly reducing echo time (TE).

Single-shot echo plane imaging (1sh-EPI) is a representative high-speed MR imaging technique in which rapidly oscillating readout gradients and phase encoding (PE) blips are integrated to obtain a whole two-dimensional K-space in a single radio frequency (RF) excitation. Therefore, the 1sh-EPI is widely used as a readout sequence for various MR imaging techniques that require high temporal resolution, such as diffusion, perfusion, and fMRI. However, the 1sh-EPI is inherently limited to linear phase encoding (PE) order due to the special zigzag K-space trajectory moving from one edge to another by using unipolar/unistep phase encoding blips. Since the echo time (TE) of 1sh-EPI is the period between the moment at which the center of the RF pulse is acquired and the moment at which the K-space center is acquired, the linearly ordered 1sh-EPI (1sh-LinEPI) has a relatively long echo time (>30 ms, without parallel imaging) as compared with other gradient echo sequences.

Since the echo time (TE) determines how much a signal is attenuated prior to image acquisition, centric phase encoding order is preferred over linear PE order in most magnetization-prepared imaging techniques (e.g., diffusion, perfusion, magnetization transfer, or inversion recovery imaging). In the common method for reducing the echo time in 1sh-EPI, only a part of the K-space (>50%) is acquired and a partial Fourier is utilized that reconstructs the whole K-space using Hermitian symmetry. The multi-shot segmented acquisition may also be an alternative method in which a segment of K-space is encoded with RF pulse excitation and multiple RF excitations are used to encode the whole K-space. In particular, a 2-shot center-output EPI (2sh-CenEPI) has been presented to increase the SNR of the perfusion signals by reducing the echo time. However, 2sh-CenEPI is generally not suitable for magnetization-prepared imaging, which requires repeated measurements to compensate for the low SNR, and thus requires a lot of preparation time for multi-shot imaging. The method described above in turn prolongs the whole scan time proportional to the number of shots.

In a previous study, phase encoding grouping has been presented to mitigate eddy-current artifacts in centric-reordered balanced steady-state free precession (bSSFP). N Consecutive phase encoding lines obtained by combining the existing centric and linear phase encoding orders are linearly encoded as a group, and several phase encoding groups encode the K-space from center to edge in a pseudo-centric manner. Through this method, the number of sudden jumps along the phase encoding direction has been reduced to 1/N, and thus dephasing due to eddy currents has been reduced accordingly.

Korean Patent Application Publication No. 10-2017-0024243 discloses a method of acquiring MRI data according to a linear phase encoding order, centric phase encoding order, pairing phase encoding order, dAVE phase encoding order, and alternating linear phase encoding order method. The contents disclosed in Korean Patent Application Publication No. 10-2017-0024243 may be utilized as basic data to help the understanding of the present disclosure.

SUMMARY

The present disclosure provides a technology capable of improving the SNR of magnetization-prepared imaging by significantly reducing echo time and achieving centric reordering in single-shot EPI of Cartesian coordinates.

In the present disclosure, a concept, phase encoding grouping is introduced into 1sh-EPI to achieve centric reordering in single-shot EPI of Cartesian coordinates.

In the present disclosure, 1sh-CenEPI is presented that encodes the whole K-space in a single-shot from center to edge by incorporating grouped oscillating readout gradients, phase encoding blips within each group, and large phase encoding jumps between two consecutive groups.

The feasibility of 1sh-CenEPI provided according to the present disclosure may be evaluated by phantom and in vivo brain experiments. In addition, 1sh-CenEPI may be applied to pseudo-continuous arterial spin labeling (pCASL) imaging to investigate the performance of magnetization-prepared imaging.

In accordance with an exemplary embodiment, a method for generating MRI data includes applying, by an MRI scanner, a radio-frequency (RF) excitation pulse, and completing, by the MRI scanner, a K-space by acquiring a plurality of phase encoding line groups, in a state in which any other RF excitation pulse is not applied after applying the RF excitation pulse. Each of the plurality of phase encoding line groups may include a plurality of phase encoding lines. An absolute value of an average phase encoding size of a phase encoding line group acquired earlier may not be greater than an absolute value of an average phase encoding size of a phase encoding line group acquired later, among the plurality of phase encoding line groups.

In this case, the plurality of phase encoding lines included in each of the plurality of phase encoding line groups may have consecutive phase encoding sizes. Here, the "consecutive" may mean that when there are a first phase encoding line and a second phase encoding line, which are arbitrary two phase encoding lines consecutively acquired on the time axis among the plurality of phase encoding lines included in each of the phase encoding line groups, any of other phase encoding lines included in the completed K-space does not have a phase encoding size between the phase encoding size of the first phase encoding line and the phase encoding size of the second phase encoding line in value.

In this case, absolute values of phase encoding sizes of the plurality of phase encoding lines included in each of the plurality of phase encoding line groups may have linearity with respect to time.

In this case, a magnitude of a gradient magnetic field of a phase encoding line acquired last in a first phase encoding line group among the plurality of phase encoding line groups may be discontinuous with a magnitude of a gradient magnetic field of a first acquired phase encoding line in a second phase encoding line group acquired immediately after acquiring the first phase encoding line group among the plurality of phase encoding line groups.

In this case, a time interval between a time at which a first phase encoding line in each of the phase encoding line groups is acquired and a time at which a second phase encoding line acquired immediately after acquiring the first phase encoding line is acquired may be a first time interval, an interval between a time at which a last acquired phase encoding line is acquired in a first phase encoding line group among the plurality of phase encoding line groups and a time at which a first acquired phase encoding line is acquired in a second phase encoding line group acquired immediately after acquiring the first phase encoding line group among the plurality of phase encoding line groups may be a second time interval, and the second time interval may be greater than the first time interval.

In the one-shot approach as in the present disclosure, a blip-up approach and a blip-down approach may need to be used together, and thus there may be a limitation to it.

The blip-up approach is an approach acquired by setting $G_{PE}$ to a positive value.

The following configurations may be provided as a method for solving the limitation.

A first set of phase encoding line groups among the plurality of phase encoding line groups may be acquired by a blip-up approach, and a second set of phase encoding line groups including remaining phase encoding line groups excluding the first set of phase encoding line groups among the plurality of phase encoding line groups may be acquired by a blip-down approach.

The blip-down approach is an approach acquired by setting the $G_{PE}$ to a negative value.

In this case, an average phase encoding size of each phase encoding line group of the first set of phase encoding line groups may have a positive value, and an average phase encoding size of each phase encoding line group of the second set of phase encoding line groups may have a negative value.

In this case, the method may further include generating, by the MRI scanner, a blip-up K-space in which values of the second set of phase encoding line groups are replaced with zero in the K-space and a blip-down K-space in which values of the first set of phase encoding line groups are replaced with zero in the K-space, generating, by the MRI scanner, a blip-up distortion image by performing an inverse Fourier transform on the blip-up K-space and a blip-down distortion image by performing the inverse Fourier transform on the blip-down K-space, generating, by the MRI scanner, a blip-up correction image corrected by unwarping the blip-up distortion image in a first direction, and a blip-down correction image corrected by unwarping the blip-down distortion image in a second direction opposite to the first direction, and generating, by the MRI scanner, a final image based on a complex average of the blip-up correction image and the blip-down correction image.

In this case, the blip-up distortion image and the blip-down distortion image may have space distortions opposite to each other, and the first direction may be a direction from an anterior part to a posterior part of a head, and the second direction may be a direction from the posterior part of the head to the anterior part.

In accordance with another exemplary embodiment, a method for generating MRI data includes applying, by an MRI computing device, a radio-frequency (RF) excitation pulse, and completing, by the MRI computing device, a K-space by acquiring a plurality of phase encoding line groups, in a state in which any other RF excitation pulse is not applied after applying the RF excitation pulse.

In this case, a first set of phase encoding line groups among the plurality of phase encoding line groups may be acquired by a blip-up approach, and a second set of phase encoding line groups including remaining phase encoding line groups excluding the first set of phase encoding line groups among the plurality of phase encoding line groups may be acquired by a blip-down approach.

In this case, the method may further include generating, by the MRI computing device, a blip-up K-space in which values of the second set of phase encoding line groups are replaced with zero in the K-space and a blip-down K-space in which values of the first set of phase encoding line groups are replaced with zero in the K-space, generating, by the MRI computing device, a blip-up distortion image by performing an inverse Fourier transform on the blip-up K-space and a blip-down distortion image by performing the inverse Fourier transform on the blip-down K-space, generating, by the MRI computing device, a blip-up correction image corrected by unwarping the blip-up distortion image in a first direction, and a blip-down correction image corrected by unwarping the blip-down distortion image in a second direction opposite to the first direction, and generating, by the MRI computing device, a final image based on a complex average of the blip-up correction image and the blip-down correction image.

In accordance with yet another exemplary embodiment, an MRI computing device includes a communication interface configured to communicate with an MRI scanner and a processing unit. The processing unit is configured to transmit a command to the MRI scanner through the communication interface, the command causing the MRI scanner to apply an RF excitation pulse, and complete a K-space by acquiring a plurality of phase encoding line groups from the MRI scanner through the communication interface in a state in which the MRI scanner does not apply any other RF excitation pulse after applying the RF excitation pulse. In this case, each of the plurality of phase encoding line groups includes a plurality of phase encoding lines. Further, an absolute value of an average phase encoding size of a phase encoding line group acquired earlier is not greater than an absolute value of an average phase encoding size of a phase encoding line group acquired later, among the plurality of phase encoding line groups.

In this case, absolute values of phase encoding sizes of the plurality of phase encoding lines included in each of the plurality of phase encoding line groups may have linearity with respect to time.

In this case, a magnitude of a gradient magnetic field of a phase encoding line acquired last in a first phase encoding line group among the plurality of phase encoding line groups may be discontinuous with a magnitude of a gradient magnetic field of a first acquired phase encoding line in a second phase encoding line group acquired immediately after acquiring the first phase encoding line group among the plurality of phase encoding line groups.

In this case, a first set of phase encoding line groups among the plurality of phase encoding line groups may be acquired by a blip-up approach, a second set of phase encoding line groups including remaining phase encoding line groups excluding the first set of phase encoding line groups among the plurality of phase encoding line groups may be acquired by a blip-down approach, an average phase encoding size of each phase encoding line group of the first set of phase encoding line groups may have a positive value, and an average phase encoding size of each phase encoding line group of the second set of phase encoding line groups may have a negative value.

In this case, the processing unit may be configured to generate a blip-up K-space in which values of the second set of phase encoding line groups are replaced with zero in the K-space and a blip-down K-space in which values of the first set of phase encoding line groups are replaced with zero in the K-space, generate a blip-up distortion image by performing an inverse Fourier transform on the blip-up K-space and a blip-down distortion image by performing the inverse Fourier transform on the blip-down K-space, generate a blip-up correction image corrected by unwarping the blip-up distortion image in a first direction, and a blip-down correction image corrected by unwarping the blip-down distortion image in a second direction opposite to the first direction, and generate a final image based on a complex average of the blip-up correction image and the blip-down correction image.

BRIEF DESCRIPTION OF THE DRAWINGS

FIG. 4 is a table presented for comparison of a readout duration and minimum echo time between 1sh-LinEPI and the 1sh-CenEPI provided by the present disclosure.

DETAILED DESCRIPTION OF EMBODIMENTS

Hereinafter, embodiments of the present invention will be described with reference to the drawings. However, the present invention is not limited to the embodiments described herein, and may be implemented by various modifications. The terms used herein are intended to aid understanding of the embodiments, and are not intended to limit the scope of the present invention. In addition, the singular forms used hereinafter include plural forms unless otherwise clearly expressed.

Figure 1:
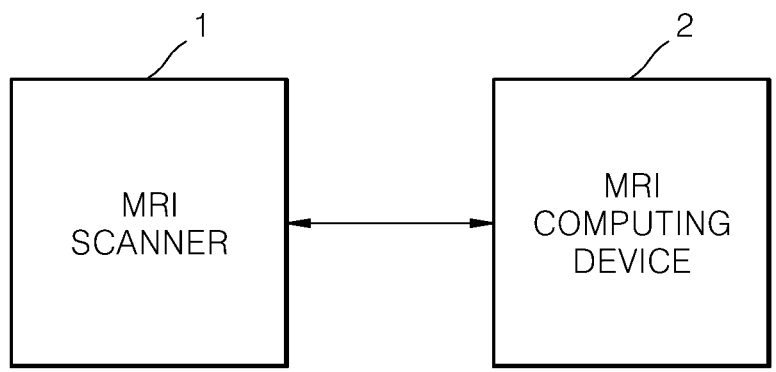
FIG. 1 illustrates an MRI scanner and an MRI computing device in accordance with an exemplary embodiment of the present disclosure.

FIG. 1 illustrates an MRI scanner and an MRI computing device in accordance with an exemplary embodiment of the present disclosure.

An MRI computing device 2 is a device connected to an MRI scanner 1.

A method for generating MRI data, which will be described below, may be performed in the MRI scanner 1 by the MRI computing device 2 causing the MRI scanner 1 to perform each step. Alternatively, each step may be performed in the MRI computing device 2.

<Method for Generating Pulse Sequence>

Hereinafter, FIG. 2a, FIG. 2b, FIG. 2c, and FIG. 2d may be collectively referred to as FIG. 2.

FIG. 2 is a diagram for describing a concept of 1sh-CenEPI provided in accordance with an exemplary embodiment of the present disclosure.

Figure 2A:
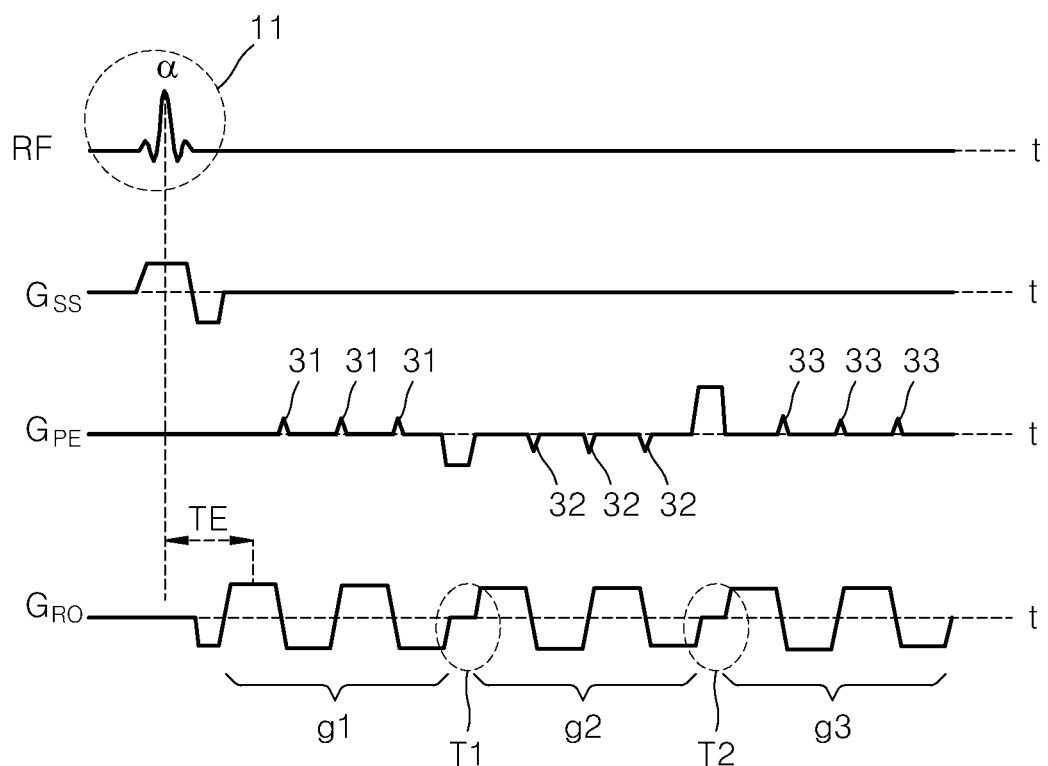
FIGS. 2a, 2b, 2c and 2d are diagrams for describing a concept of 1sh-CenEPI provided in accordance with an exemplary embodiment of the present disclosure.

FIG. 2a illustrates a pulse sequence diagram on a time axis of 1sh-CenEPI provided in accordance with an exemplary embodiment of the present disclosure.

In FIG. 2a, as pulse sequence diagrams, a RF pulse sequence diagram, a GSS pulse sequence diagram, a GPE pulse sequence diagram, and a GRO pulse sequence diagram are presented, which are pulse sequence diagrams for acquiring a K-space.

Figure 2B:
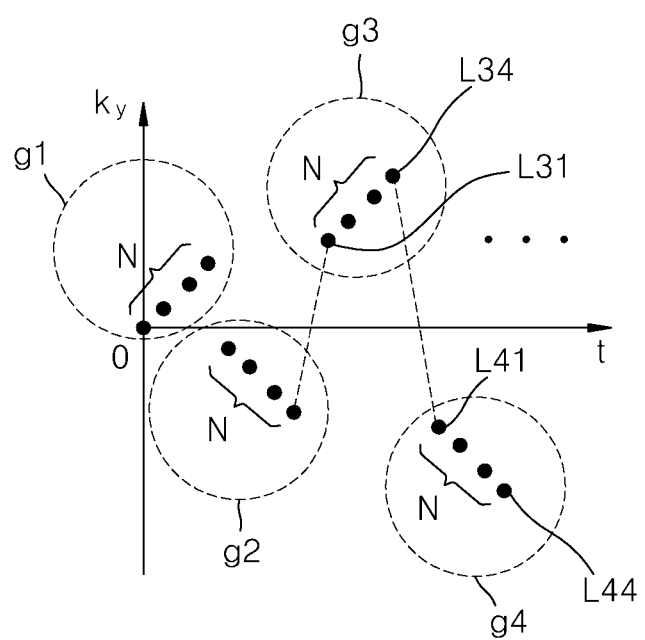

FIG. 2b illustrates a K-space trajectory on the time axis of 1sh-CenEPI provided in accordance with an exemplary embodiment of the present disclosure.

Figure 2C:
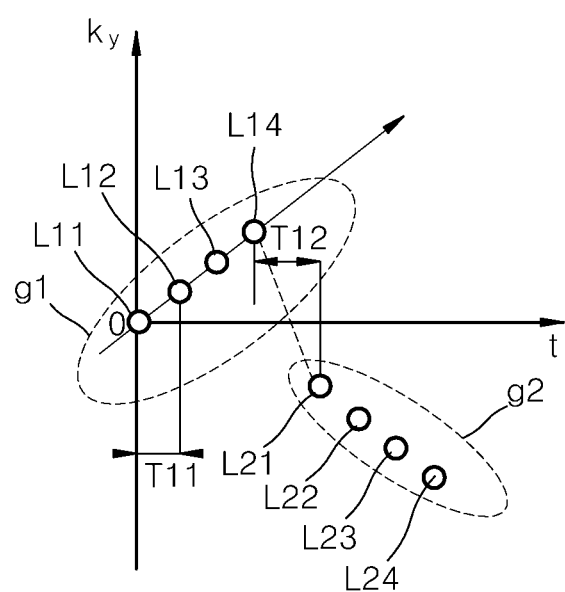

FIG. 2c illustrates only a first group and a second group of FIG. 2b.

Figure 2D:
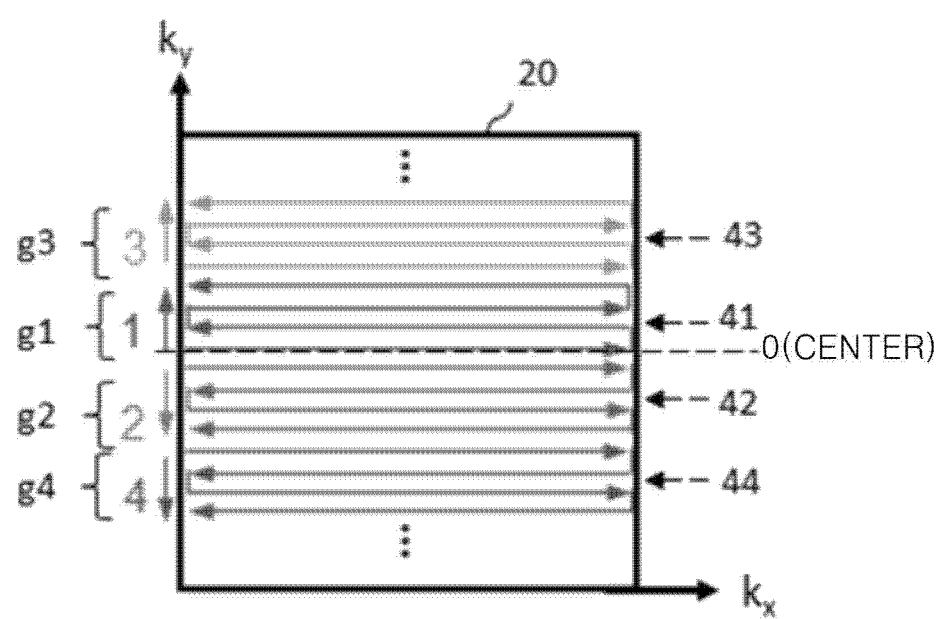

FIG. 2d illustrates a spatial domain of the 1sh-CenEPI provided in accordance with an exemplary embodiment of the present disclosure.

Hereinafter, the method for generating MRI data will be described with reference to FIG. 1 and FIG. 2a to FIG. 2d.

The method for generating MRI data according to the present disclosure may include the following steps S10 and S20.

In step S10, the MRI computing device 2 (or the MRI scanner 1) may apply an RF excitation pulse. It can be seen from FIG. 2a that the RF excitation pulse 11 is applied only once.

In step S20, the MRI computing device 2 (or the MRI scanner 1) may complete a K-space 20 by acquiring a plurality of phase encoding line groups g1 to g4 in a state in which any other RF excitation pulse is not applied after applying the RF excitation pulse 11.

That is, referring to FIG. 2d, after the single RF excitation in step S10, a predetermined number of groups (e.g., g1 to g4) of oscillating readout gradients and the groups (g1 to g4) and jump phase encoding gradients between the groups g1 to g4 may be combined to cover the whole K-space 20 from center to edge. In this case, the gradient may be referred to as a phase encoding line hereinafter. The gradient will be described in detail later.

As in FIG. 2d, the polarities of the phase encoding blips 31, 32, and 33 alternate with each other in each group, as in FIG. 2a, to cover both positive (+) ky and negative (−) ky. That is, looking at the $G_{PE}$ pulse sequence diagram in FIG. 2a, it can be seen that the polarities of the blips 31, 32, and 33 are alternately repeated with a positive polarity and a negative polarity. In this case, the positively polarized blips 31 and 33 may be indicated by triangles in the positive direction, and the negatively polarized blips 32 may be indicated by an inverted triangle in the negative direction.

Referring to a GRO pulse sequence diagram of FIG. 2a, it can be seen that one group (g1, g2, g3, . . . ) may be generated to correspond to one set of blips (31, 32, 33, . . . ).

Hereinafter, the groups g1 to g4 will be described.

Referring to FIG. 2b and FIG. 2c, the number of readout gradients L11, L12, L13, . . . in each group (e.g., g1) may be referred to as N (e.g., 4). In the 1sh-CenEPI provided in accordance with an exemplary embodiment of the present disclosure, bipolar readout gradients of a specific number N (e.g., 4) are linearly encoded as a group, and here, there are several groups (e.g., g1 to g4) that encode the K-space 20 in a centric manner from center to edge. The same phase encoding blips are used within each readout group and there are phase encoding jumps between two consecutive groups. For efficient centric reordering, the polarities of the phase encoding blips are crossed for each group.

For example, referring to FIG. 2a and FIG. 2d together, an average phase encoding size ky of a first set of phase encoding line group g1 may have a positive value 41 during a duration in which the blips 31 have positive polarity, the average phase encoding size ky of a second set of phase encoding line group g2 may have a negative value 42 during a duration in which subsequent blips 32 have negative polarity, and the average phase encoding size ky of a third set of phase encoding line group g3 may have a positive value 43 during a duration in which subsequent blips 33 have positive polarity.

In FIG. 2d, two upward-pointing arrows presented next to the first set of phase encoding line group g1 and the third set of phase encoding line group g3 presented to the left of the ky axis indicate blip-up. In addition, two downward-pointing arrows presented next to the second set of phase encoding line group g2 and a fourth set of phase encoding line group g4 presented to the left of the ky axis indicate blip-down.

That is, as the polarities of the blips are repeated, the average phase encoding size of the groups may also have a positive value and a negative value alternately.

Referring back to FIG. 2b and FIG. 2c, for example, a plurality of phase encoding lines (e.g., N=4) L11 to L14 included in the first set of phase encoding line group g1 may have consecutive phase encoding sizes. In addition, the absolute values of the phase encoding sizes ky of the plurality of phase encoding lines (e.g., N=4) L11 to L14 included in the first set of phase encoding line group g1 may have linearity with respect to time.

A plurality of phase encoding lines (e.g., 4) L21 to L24 included in the second set of phase encoding line group g2 may have consecutive phase encoding sizes. In addition, the absolute values of the phase encoding sizes ky of the plurality of phase encoding lines (e.g., N=4) L21 to L24 included in the second set of phase encoding line group g2 may have linearity with respect to time.

A plurality of phase encoding lines (e.g., N=4) L31 to L34 included in the third set of phase encoding line group g3 may have consecutive phase encoding sizes. In addition, the absolute values of the phase encoding sizes ky of the plurality of phase encoding lines (e.g., N=4) L31 to L34 included in the third set of phase encoding line group g3 may have linearity with respect to time.

A plurality of phase encoding lines (e.g., N=4) L41 to L44 included in the fourth set of phase encoding line group g4 may have consecutive phase encoding sizes. In addition, the absolute values of the phase encoding sizes ky of the plurality of phase encoding lines (e.g., N=4) L41 to L44 included in the fourth set of phase encoding line group g4 may have linearity with respect to time.

In this case, referring to FIG. 2c, a magnitude ky of a gradient magnetic field of the phase encoding line L14 acquired last in the first set of phase encoding line group g1 may be discontinuous with a magnitude ky of a gradient magnetic field of the first acquired phase encoding line L21 in the second set of phase encoding line group g2 acquired immediately after acquiring the first set of phase encoding line group g1.

Similarly, referring to FIG. 2b, a magnitude ky of a gradient magnetic field of the phase encoding line L24 acquired last in the second set of phase encoding line group g2 may be discontinuous with a magnitude ky of a gradient magnetic field of the first acquired phase encoding line L31 in the third set of phase encoding line group g3 acquired immediately after acquiring the second set of phase encoding line group g2.

In addition, a magnitude ky of a gradient magnetic field of the phase encoding line L34 acquired last in the third set of phase encoding line group g3 may be discontinuous with a magnitude ky of a gradient magnetic field of the first acquired phase encoding line L41 in the fourth set of phase encoding line group g4 acquired immediately after acquiring the third set of phase encoding line group g3.

In this case, due to large phase encoding jumps between groups (e.g., g1 and g2) that may not fit in the two ramp times of readout gradients, small time intervals (gaps) (T1, T2, . . . , of FIGS. 2a, and T12 of FIG. 2c) may be inserted during phase encoding jumps. In principle, the total amount of the time intervals may vary depending on the value of N.

Referring back to FIG. 2c, a time interval between a time at which the first phase encoding line L11 in each phase encoding line group (e.g., g1) is acquired and a time at which the second phase encoding line L12 acquired immediately after acquiring the first phase encoding line L11 is acquired may be defined as a first time interval T11.

In addition, an interval between a time at which the last acquired phase encoding line L14 is acquired in the first set of phase encoding line group g1 among the plurality of phase encoding line groups g1 to g4 and a time at which the first acquired phase encoding line L21 is acquired in the second set of phase encoding line group g2 acquired immediately after acquiring the first set of phase encoding line group g1 among the plurality of phase encoding line groups g1 to g4 may be defined as a second time interval T12.

In this case, the second time interval T12 may be greater than the first time interval T11.

In an exemplary embodiment of the present disclosure, the time intervals between the groups (g1 and g2, g2 and g3, or g3 and g4) may be set to be the same regardless of the amplitudes of the phase encoding jump gradients.

Referring back to FIG. 2d by summarizing the above, it can be understood that the first set of phase encoding line group g1 and the third set of phase encoding line group g3 are acquired by the blip-up approach (the blip 31 and the blip 33 in FIG. 2a), and the second set of phase encoding line group g2 and the fourth set of phase encoding line group g4 are acquired by the slip-down approach (the blip 32 in FIG. 2a).

The first set of phase encoding line group g1 may have a positive average phase encoding size (ky value) due to the positively polarized blips 31, and then the second set of phase encoding line group g2 may have a negative average phase encoding size (ky value) due to the negatively polarized blips 32.

In this case, the absolute value of the average phase encoding size of the first set of phase encoding line group g1 may not be greater than the absolute value of the average phase encoding size of the second set of phase encoding line group g2.

Similarly, the absolute value of the average phase encoding size of the second set of phase encoding line group g2 may not be greater than the absolute value of the average phase encoding size of the third set of phase encoding line group g3 that are acquired later.

In addition, the absolute value of the average phase encoding size of the third set of phase encoding line group g3 may not be greater than the absolute value of the average phase encoding size of the fourth set of phase encoding line group g4 that are acquired later.

In an exemplary embodiment of the present disclosure, a minimum-phase RF pulse may be used to further reduce the echo time.

In the present disclosure, the presented pseudo-centric ordering method may also be applied to single-shot SE-EPI (spin-echo EPI).

<Phase Correction Method>

In the 1sh-LinEPI in the related art, in general, three navigator echoes are acquired without phase encoding gradients before data collection, and phase offsets calculated in the three echoes are used to correct misalignment between odd and even echoes acquired with opposite readout gradient polarities (3-echo phase correction method).

However, referring to the GRO pulse sequence diagram illustrated in FIG. 2a, for the 1sh-CenEPI provided in accordance with an exemplary embodiment of the present disclosure, multi-phase encoding jumps between groups cause a time delays T1 and T2 of approximately a maximum of 100 μs for each group, and thus this should also be taken into account in the phase correction.

In an exemplary embodiment of the present disclosure, for phase correction of the 1sh-CenEPI trajectory, it is possible to acquire the whole K-space without phase encoding gradients to measure not only the phase offset from the bipolar readout gradients, but also the phase offset induced by the time delay. In this whole-echo phase correction method, both an original EPI K-space and a reference K-space data are one-dimensional (1-D)-Fourier transformed along a readout direction.

In an exemplary embodiment of the present disclosure, a phase of the corresponding echo signal of an original EPI data set may be modified by using a phase measured from a reference image on which a 1-D-Fourier transformation is performed for each phase encoding line. Then, a final image may be acquired by performing the 1-D-Fourier transformation on the phase-corrected signal along the phase encoding direction.

The 3-echo phase correction method in the related art may be compared with the whole-echo phase correction method for 1sh-CenEPI imaging.

<Distortion Correction Method>

One of the most widely used distortion correction methods for EPI is the BO field map approach, where the BO field map is calculated in two gradient echo images using different echo times but having the same spatial resolution as the EPI. A pixel shift map (PSM) may be derived from the acquired field map by dividing the field map into bandwidths along the phase encoding direction. Then, a pixel position is corrected through one-dimensional interpolation of the PSM by using the distorted EPI image, which is referred to as an unwarping process. In 1sh-LinEPI, the phase encoding direction is unidirectional as blip-up or blip-down, and in the 1sh-CenEPI provided in the present disclosure, the phase encoding direction is bidirectional since two segments have opposite phase encoding directions. Therefore, the existing distortion correction method using the field map may not be directly applied to the 1sh-CenEPI of the present disclosure.

Figure 3:
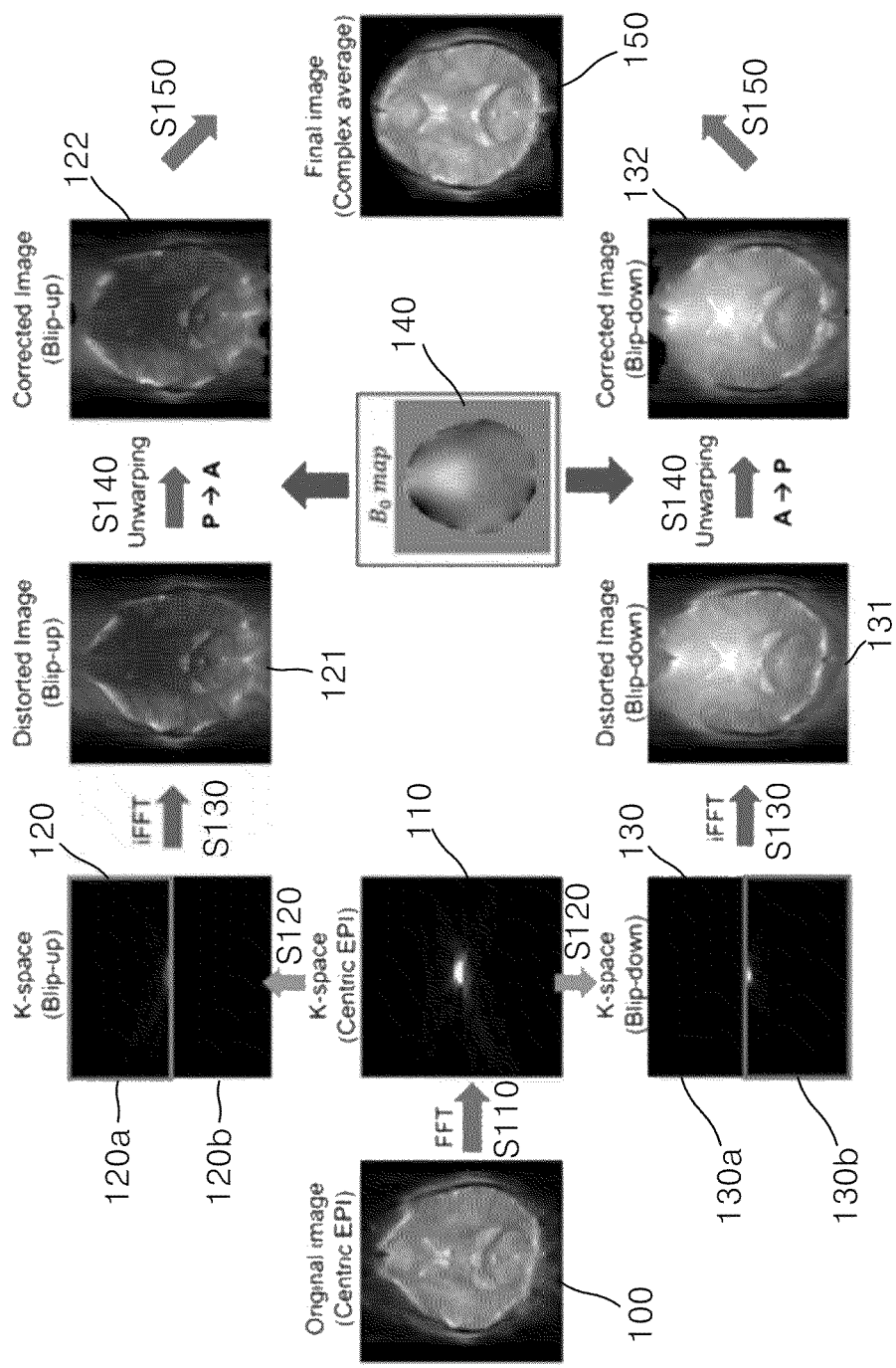
FIG. 3 is a schematic diagram illustrating a method of correcting distortion for the 1sh-CenEPI provided in accordance with an exemplary embodiment of the present disclosure.
Figure 5A:
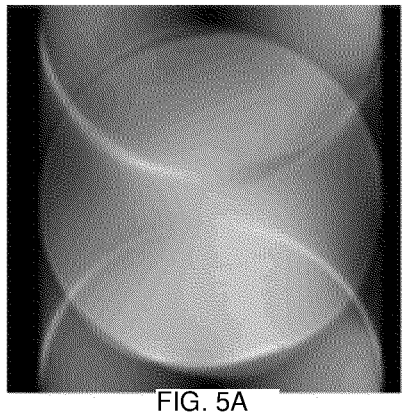
FIGS. 5a, 5b, 5c, 5d, 5e, and 5f are data describing the effect of phase correction on a 1sh-CenEPI image.
Figure 5D:
Figure 5B:
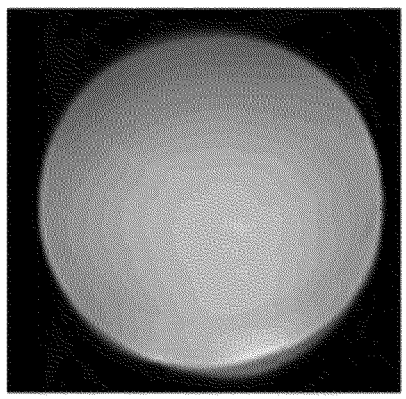
Figure 5E:
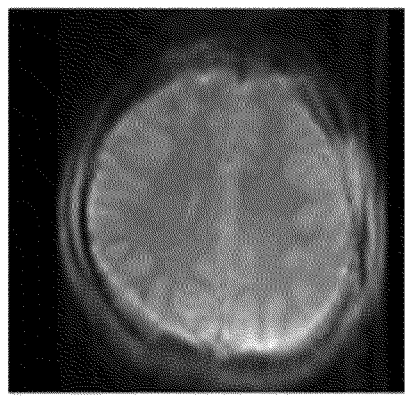
Figure 5C:
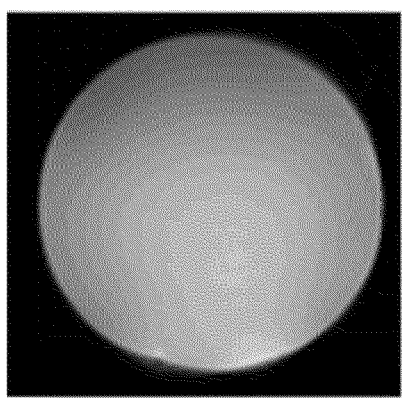
Figure 5F:
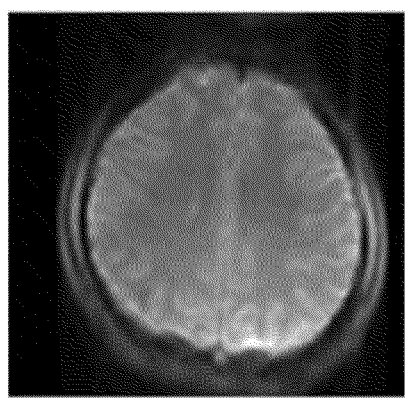
Figure 6A:
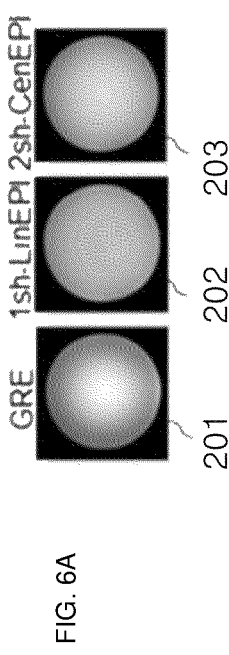
FIGS. 6a, 6b, 6c, and 6d illustrate phantom and human brain GE-EPI images acquired by various reordering schemes in accordance with an exemplary embodiment of the present disclosure.
Figure 6B:
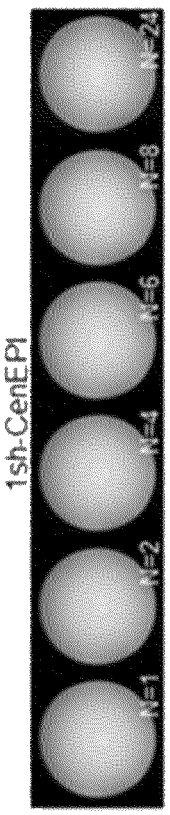
Figure 6C:
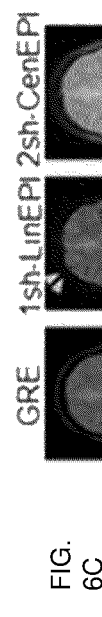
Figure 6D:
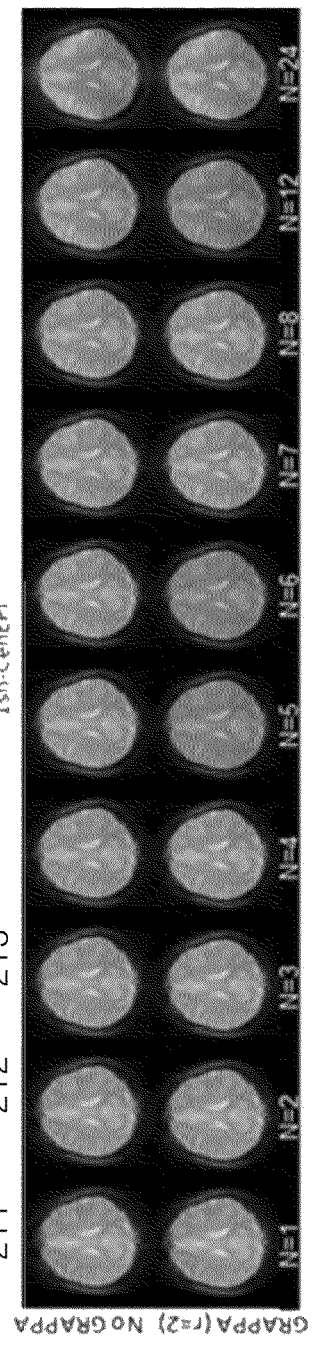

FIG. 3 is a schematic diagram illustrating a method of correcting distortion for the 1sh-CenEPI provided in accordance with an exemplary embodiment of the present disclosure.

In the present disclosure, the existing field map method has been modified for the provided 1sh-CenEPI.

Hereinafter, a method of correcting the above-described distortion will be described with reference to FIG. 1 and FIG. 3 together.

In step S110, the MRI computing device 2 may first perform fast Fourier transformation (FFT) on an original image 100 acquired by the centric EPI to generate an original K-space 110 by the centric EPI.

Then, in step S120, the MRI computing device 2 may divide the original K-space 110 into two different K-space data sets 120 and 130, taking into account two different phase encoding directions in the single K-space. In this case, one of the two different K-space data sets 120 and 130 is a blip-up K-space 120 with an upper-half (blip-up) 120a of the original K-space 110, and the other is a blip-down K-space 130 with a lower-half (blip-down) 130b of the original K-space 110. The remainder 120b and 130a of the K-spaces 120 and 130 are filled with zeros, respectively.

Then, in step S130, the MRI computing device 2 may generate a blip-up distortion image 121 by performing an inverse Fourier transform on the blip-up K-space 120 and a blip-down distortion image 131 by performing the inverse Fourier transform on the blip-down K-space 130. In this case, the blip-up distortion image 121 and the blip-down distortion image 131 are images having spatial distortions opposite to each other.

Then, in step S140, each of the distortion images 121 and 131 may be modified with opposite polarities to each other by using the same BO-map-based PSM 140. That is, a blip-up correction image 122 corrected by unwarping the blip-up distortion image 121 (P→A unwarping) may be generated, and a blip-down correction image 132 corrected by unwarping the blip-down distortion image 131 (A→P unwarping) may be generated.

Finally, in step S150, a final image 150 without distortion may be generated by combining the blip-up correction image 122 and the blip-down correction image 132 with each other in a manner of calculating a complex average of the blip-up correction image 122 and the blip-down correction image 132. In this case, field map modification and unwarping may be made by using FUGUE and PRELUDE in FSL (FMRIB Software Library v5.0, University of Oxford, Oxford, UK, http://fsl.fmrib.ox.ac.uk/) package, respectively.

<Implementation and Verification of Effectiveness of Present Disclosure>

Hereinafter, an actual example of a method for generating MRI data provided in accordance with an exemplary embodiment of the present disclosure will be described. The content presented below is intended to aid understanding of the present disclosure, and should not be construed as limiting the scope of the present disclosure.

1. Acquisition of Data

Experiments for verification of the present disclosure were performed on a doped water spherical head phantom (Siemens D170 with a diameter of 170 mm) and five healthy volunteers by using a 3T (Skyra, Siemens, Erlangen) with a 20-channel (ch) head coil, which were approved by the local institutional review board. The same parameters were used in the phantom and in vivo experiments except for a flip angle (Ernst angle). Imaging parameters of GE-EPI are as follows: TR=300 ms, TE=minimum, matrix size=96×96, FOV=192×192 mm2, slice thickness=5 mm, number of slices=1, FA=60° (phantom)/35° (in vivo), receiver bandwidth=1580 Hz/px, phase encoding direction=A-P. Here, in 'A-P', 'A' means anterior and 'P' means posterior. The 'A-P' direction is a concept distinct from the 'R-L' (right-left) direction and the 'H-F' (head-feet) direction.

A fat suppression module was applied for in vivo brain imaging. In vivo data sets were all acquired via generalized auto-calibrating partially parallel acquisitions (GRAPPA) along the phase encoding direction (AP) using 24 fully sampled reference lines (i.e., ACS=24), by using or without using 2-fold acceleration. For SE-EPI imaging, the same parameters were used except for matrix size=64×64 and bandwidth=2520 Hz/px. For multi-slice imaging, the number of slices=7, slice thickness=5 mm, and slice spacing=1 mm, and remaining parameters were the same. For B0 mapping, two standard GE images were acquired with different echo times of 4.92 ms and 7.38 ms and FOV and matrix sizes identical to those of GE-EPI. All data analysis and post-processing of the present disclosure were performed by using MATLAB (The MathWorks, Inc).

2. Application to pCASL Imaging

As one of the promising applications for magnetization-prepared imaging, the 1sh-cenEPI provided by the present disclosure was evaluated by using 2D pCASL sequences for the same five healthy volunteers, as compared to 1sh-LinEPI. The imaging parameters of the 2D EPI readout are as follows: TR=4000 ms, TE=minimum (sup table S1), flip angle=90°, FOV=192×192 mm2, slice thickness=5 mm, receiver Bandwidth=1565 Hz/pixel, matrix size=64×64. The pCASL labeling parameters are as follows: RF pulse shape=hanning window, RF duration=0.5 ms, flip angle=25°, interval between two RF pulses=320 µs, slice selection gradients=6 mT/m, label duration=1500 ms, post-labeling delay=1200 ms, distance between labeling and imaging plane=9 cm, balanced tagging scheme and no background suppression. A total of 36 pairs of label and control images were acquired with a total scan time of approximately 5 mins for each data set.

Perfusion images were derived from pair-wise subtraction of control and label images. For a steady state condition, the first two dynamic images (i.e., one label-control pair) were excluded before averaging. In addition, a cerebral blood flow (CBF) of each voxel was calculated using the following [Equation 1].

$$CBF = \frac{6000 \cdot \lambda \cdot (SI_{control} - SI_{label}) \cdot \frac{PLD}{e^{T_{1,blood}}}}{2 \cdot \alpha \cdot T_{1,blood} \cdot SI_{PD} \cdot \left(1 - e^{\frac{\tau}{T_{1,blood}}}\right)} \left[\frac{ml}{100\ g\ min}\right], \quad \text{[Equation 1]}$$

where $SI_{control}$, $SI_{label}$ and $SI_{PD}$ are mean signal intensities of control, label, and proton density weighted (M0) images, $\lambda$ is a blood-brain partition coefficient (=0.9 ml/g), $T_{1,\,blood}$ is the longitudinal relaxation time of blood (=1.65 sec), $\alpha$ is a labeling efficiency (=0.85), and $\tau$ is a labeling duration (=1.5 sec).

For quantitative comparison of perfusion signals, temporal SNR (tSNR), spatial SNR (sSNR) and GM-WM contrast ratio were measured and compared. The tSNR was calculated in dynamic perfusion images as the mean perfusion signal divided by its standard deviation. sSNR values were calculated in mean perfusion weighted images as the mean perfusion signal intensity of a region of interest (ROI) divided by the standard deviation of the noise in the background. The GM-WM contrast ratio was calculated as the ratio of the mean CBF values of the two regions.

3. Results 3.1. Minimum Echo Time and Readout Duration

FIG. 4 is a table presented for comparison of a readout duration and minimum echo time between 1sh-LinEPI and the 1sh-CenEPI provided by the present disclosure.

In FIG. 4, minimum echo times Minimum TEs and readout durations Readout Durations were compared and measured for the 1sh-LinEPI and 1sh-CenEPI by using various different Ns (e.g., N=1, 2, 3, 4, 5, 6, 8, 12, or 24).

That is, the first column of the table indicates values of minimum echo times Minimum TE, the second column indicates values of readout durations Readout Duration, and each row indicates the 1sh-LinEPI and the 1sh-CenEPI for which different Ns are used.

The minimum echo time was significantly decreased from 50.4 ms for the 1sh-LinEPI (ss-EPI (Linear) in the first row) to 1.4 ms for the 1sh-CenEPI (second to tenth rows), whereas the difference in readout duration was less than 10% for 4. For the 1sh-CenEPI, the duration between the 180° RF pulse and the center echo may be reduced to less than 2 ms, which significantly reduces the echo time.

3.2. Phase Correction Results

FIG. 5 is data describing the effect of phase correction on a 1sh-CenEPI image.

Parts (a), (b), and (c) of FIG. 5 are images of a phantom, and parts (d), (e), and (f) of FIG. 5 are images of a human brain.

Parts (a) and (d) of FIG. 5 are images before phase correction is performed on the 1sh-CenEPI image. Severe N/2 ghost artifacts and geometric distortions were observed in the 1sh-CenEPI images (N=4) for both the phantom and brain.

Parts (b) and (e) of FIG. 5 are images in the case of three-echo correction in the related art. Existing 3-echo phase correction reduces most of the N/2 ghost artifacts, but weak geometric distortions and blurring still remain in both phantom and brain images. The remaining distortions and blurring are at the bottom of part (b) of FIG. 5 and at the top of part (e) of FIG. 5.

Parts (c) and (f) of FIG. 5 are images when whole-echo correction is performed. The distortions are significantly reduced in the whole echo phase correction method.

It can be seen that, comparing the whole-echo correction with the 3-echo EPI phase correction in the related art, image distortion and signal dropout due to phase errors are clearly reduced after the whole-echo phase correction.

3.3. Experiment Results

FIG. 6 illustrates phantom and human brain GE-EPI images acquired by various reordering schemes in accordance with an exemplary embodiment of the present disclosure.

Part (a) of FIG. 6 illustrates phantom GE-EPI images acquired according to methods (GRE, 1sh-LinEPI, 2sh-CenEPI) in the related art. The phantom GE-EPI image acquired according to the GRE is shown as reference number 201, the phantom GE-EPI image acquired according to the 1sh-LinEPI is shown as reference number 202, and the phantom GE-EPI image acquired according to the 2sh-CenEPI is shown as reference number 203.

Part (b) of FIG. 6 illustrates phantom GE-EPI images acquired according to 1sh-CenEPI having six different N values (N=1, 2, 4, 6, 8, or 24) provided according to an exemplary embodiment of the present disclosure.

In part (c) of FIG. 6, the gradient echo image is positioned to the left, the 1sh-LinEPI image is positioned at the center, and an image acquired according to the 2sh-CenEPI are positioned to the right. That is, the image acquired according to the gradient echo in the related art is the image of reference number 211, the image acquired according to the 1sh-LinEPI is the image of reference number 212, and the image acquired according to the 2sh-CenEPI is the image of reference number 213.

Part (d) of FIG. 6 is images acquired according to 1sh-CenEPI having ten different N values (N=1, 2, 3, 4, 5, 6, 7, 8, 12, or 24) provided according to an exemplary embodiment of the present disclosure. The upper images are images acquired by not applying GRAPPA, and the lower images are images acquired by applying GRAPPA.

Referring to part (b) of FIG. 6, the images show minimal geometric distortions at all six different Ns, which are similar to the first 1sh-LinEPI and 2sh-CenEPI images as well as the existing gradient echo images shown in part (a) of FIG. 6.

Referring to the upper part (first row, No GRAPPA) of part (d) of FIG. 6, in representative human brain EPI images, the 1sh-CenEPI provided in the present disclosure show comparable image quality to the 2sh-CenEPI images for a wide range of Ns (N=1, 2, 3, . . . and 24).

Referring to the lower part (second row, GRAPPA (r=2)) of part (d) of FIG. 6, GRAPPA further reduces distortions of the anterior part of the brain.

Compared to the gradient echo image 211 without distortion presented on the left side of part (c) of FIG. 6, the existing image 212 of 1sh-LinEPI presented in the center of part (c) of FIG. 6 shows distortions at the anterior part of the brain, but shows reduced distortions in the 2sh-CenEPI as in the image 213 presented on the right side of part (c) of FIG. 6.

Compared to the 1sh-LinEPI, the provided 1sh-CenEPI shows slight geometric distortions in the anterior region similar to that of the 1sh-LinEPI, but shows a different pattern from the 1sh-LinEPI. Similarly, for the single-shot SE-EPI, phantom and human brain images show minimal geometric distortions in the provided 1sh-CenEPI, which are similar to the distortion-free gradient echo images.

3.4. Distortion Correction Results

Figures 7A, 7B, 7C, 7D, 7E, 7F:
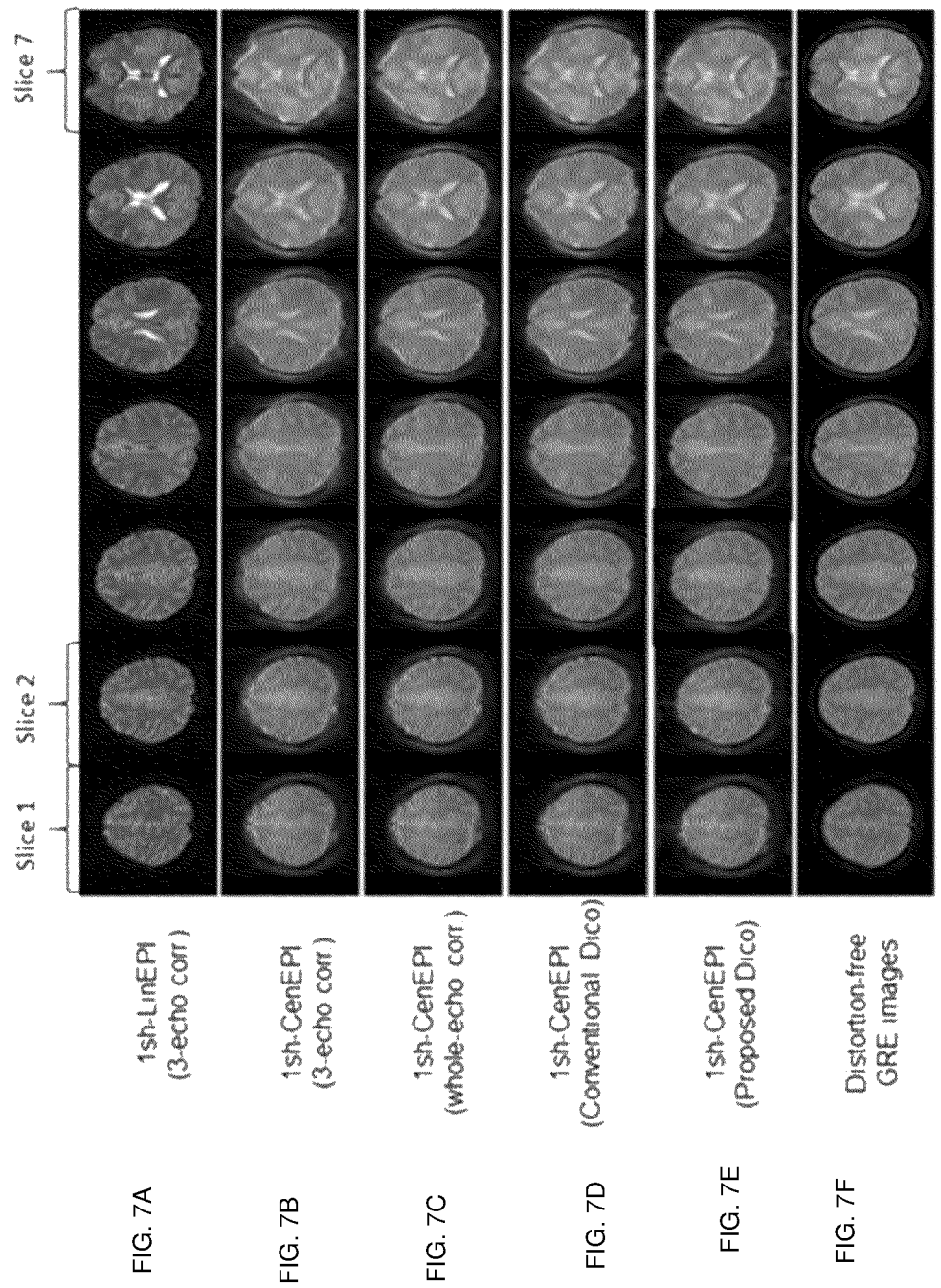
FIGS. 7a, 7b, 7c, 7d, 7e and 7f illustrate multi-slice human brain 1sh-CenEPI images, 1sh-LinEPI images, and GRE images corrected by various phase/geometric distortion correction methods.

FIG. 7 illustrates multi-slice human brain 1sh-CenEPI images, 1sh-LinEPI images, and GRE images corrected by various phase/geometric distortion correction methods.

Part (a) of FIG. 7 is a result of correcting images acquired by the 1sh-LinEPI by the 3-echo correction method.

Part (b) of FIG. 7 is a result of correcting images acquired by the 1sh-CenEPI by the 3-echo correction method.

Part (c) of FIG. 7 is a result of correcting images acquired by the 1sh-CenEPI by the whole-echo correction method.

Part (d) of FIG. 7 is a result of correcting images acquired by the 1sh-CenEPI by the distortion correction method in the related art.

Part (e) of FIG. 7 is a result of correcting images acquired by the 1sh-CenEPI by the distortion correction method provided in the present disclosure.

Part (f) of FIG. 7 shows GRE images without distortion.

In FIG. 7, images of the 1sh-CenEPI with 7 different slices are compared before and after applying the modified field map-based distortion correction. The whole echo correction of part (c) of FIG. 7 reduces geometric distortion of 1sh-CenEPI images as compared with the 3-echo correction in the related art as shown in part (b) of FIG. 7. However, the lower slices near the air/tissue interface of sinus cavities still show significant spatial distortion due to magnetic inhomogeneity.

When the distortion correction method modified according to the present disclosure is used as shown in part (e) of FIG. 7, most geometric distortions and blurring are removed, which may be confirmed by the existing distortion-free echo images as shown in part (f) of FIG. 7. The result shows that the modified distortion correction method works well with the provided 1sh-CenEPI.

3.5. pCASL Results

FIG. 8a, FIG. 8b, FIG. 8c, and FIG. 8d to be described below may be collectively referred to as FIG. 8.

FIG. 8a to FIG. 8d illustrate perfusion-weighted images of five subjects acquired using the 1sh-LinEPI and 1sh-CenEPI.

Figure 8A:
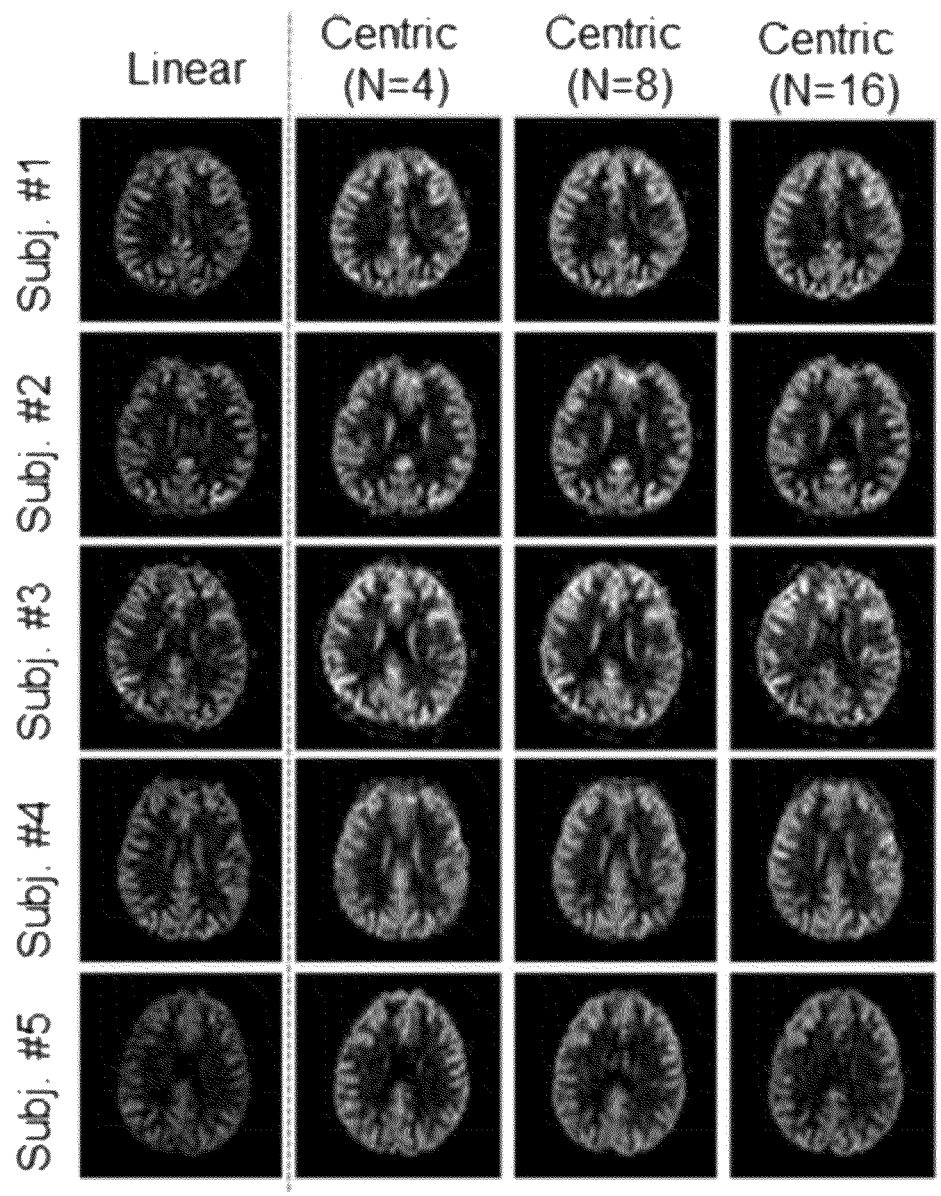
FIGS. 8a, 8b, 8c and 8d illustrate perfusion-weighted images of five subjects acquired using the 1sh-LinEPI and 1sh-CenEPI.

Each row in FIG. 8a represents five different subjects.

In FIG. 8a, a first column is a result using the 1sh-LinEPI, a second column is a result using the 1sh-CenEPI (N=4), a third column is a result using the 1sh-CenEPI (N=8), and a fourth column is a result using the 1sh-CenEPI (N=16).

As can be seen in FIG. 8a, the signal intensity of the 1sh-CenEPI perfusion-weighted images is much higher than that of 1sh-LinEPI in the visual examination of all subjects.

Figure 8B:
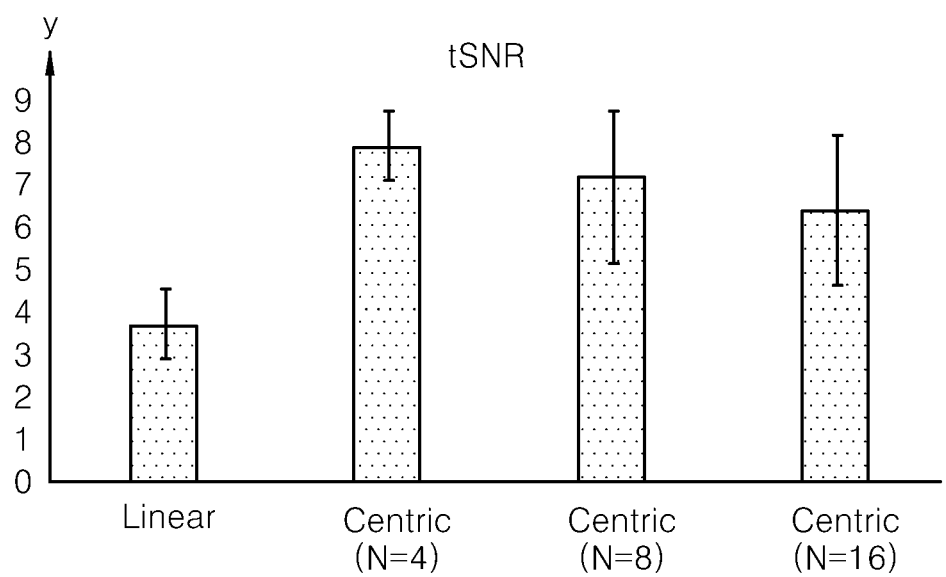

FIG. 8b shows a graph of temporal SNR (tSNR) measured from an ROI in gray matter obtained using the 1sh-LinEPI and the 1sh-CenEPI.

In the graph of SNR, the horizontal axis represents the 1sh-LinEPI, the 1sh-CenEPI (N=4), the 1sh-CenEPI (N=8), and the 1sh-CenEPI (N=16) in this order, and the vertical axis (y) represents the tSNR value.

The tSNR values of the 1sh-CenEPI for all different N values (tSNR=8.0, 7.3, and 6.5 for N=4, 8, and 16, respectively) are more than double that of the 1sh-LinEPI (tSNR=3.7).

Figure 8C:
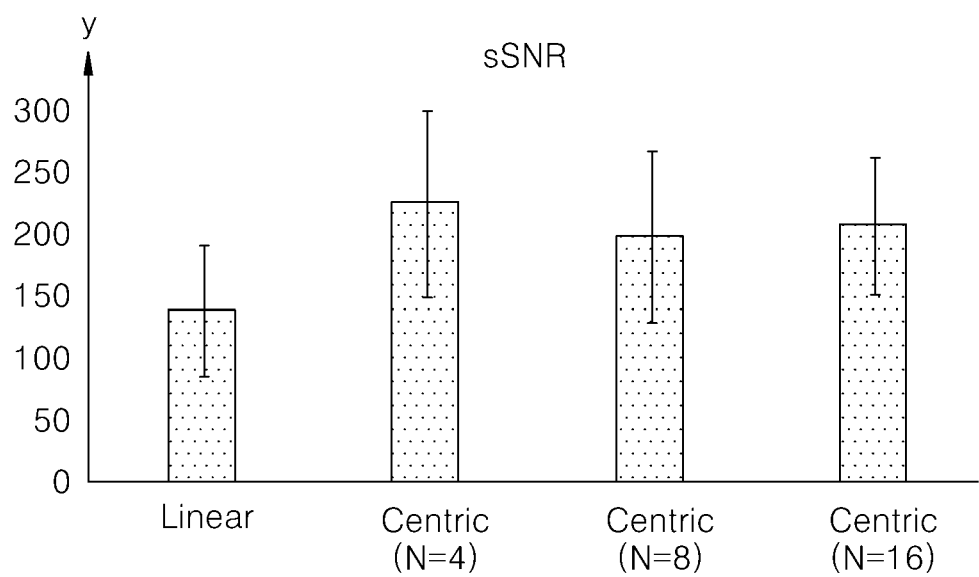

FIG. 8c shows spatial SNR (sSNR) of perfusion-weighted images from the gray matter ROI. In the graph of sSNR, the horizontal axis represents the 1sh-LinEPI, the 1sh-CenEPI (N=4), the 1sh-CenEPI (N=8), and the 1sh-CenEPI (N=16) in this order, and the vertical axis (y) represents the sSNR value. The sSNR values of the 1sh-CenEPI are approximately 1.5 times higher than those of the 1sh-LinEPI.

Figure 8D:
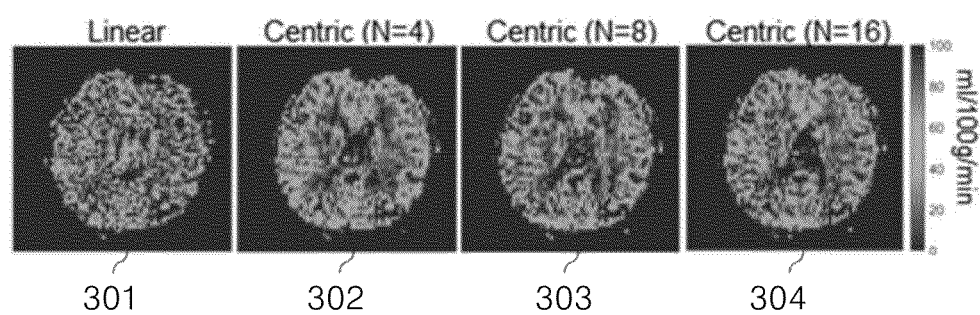

FIG. 8d shows representative quantitative CBF maps obtained by the 1sh-LinEPI and 1sh-CenEPI. Although both the 1sh-LinEPI and the provided 1sh-CenEPI show similar quantitative CBF values, the maps 302-304 of 1sh-CenEPI show higher SNR than a map 301 of the 1sh-LinEPI visually and quantitatively.

In the present disclosure, the 1sh-CenEPI is provided which is a new data collection method that implements centric reordering in single-shot EPI using the concept of topological encoding grouping. Reference images of the 1sh-CenEPI show minimal geometric distortions after modified geometric distortion correction using a BO map and whole-echo phase correction, as compared with the images of the existing 1sh-LinEPI and 2sh-CenEPI in the phantom and in vivo brain.

The existing 3-echo phase correction was not suitable for the provided 1sh-CenEPI due to the phase discontinuity between readout groups, which may be solved by the whole-echo phase correction method. In addition, the existing BO map-based geometric distortion correction method needs to be modified and optimized for the provided 1sh-CenEPI since the phase encoding directions are opposite in one K-space.

The geometric distortion correction modified according to the present disclosure successfully corrects the heterogeneous spatial pixel shift between the blip-up group and the blip-down group.

As far as the inventors of the present disclosure know, the present disclosure is the first to enable centric phase encoding reordering in the single-shot EPI in Cartesian coordinates. When applied to magnetization-prepared imaging, the provided 1sh-CenEPI is clearly advantageous over both the existing 1sh-LinEPI and 2sh-CenEPI. As compared with the 1sh-LinEPI, the 1sh-CenEPI may achieve much higher SNR in perfusion weighted images due to the shorter echo time as shown in FIG. 4. The 1sh-CenEPI requires a single preparing time, whereas the 2sh-CenEPI requires twice the preparing time to acquire the whole image, doubling the total scan time. Referring to part (c) and part (d) of FIG. 6, the provided 1sh-CenEPI has twice as long a readout duration as the 2sh-CenEPI, resulting in some blurring. Referring to the lower part of part (d) of FIG. 6, the above-mentioned problem may be alleviated by using the GRAPPA for the 1sh-CenEPI, which may achieve similar echo train lengths (i.e., similar readout duration) despite a slight decrease in SNR.

The selection of the optimal value of N may be one of the important problems of the provided 1sh-CenEPI. The baseline image quality of the 1sh-CenEPI was constant for various N values as shown in FIG. 6. Taking into account the extension of the total readout window, the total delay is less than 10% of the total readout time, and thus the 1sh-CenEPI with 4 may be recommended (see FIG. 4). Taking into account magnetization-prepared imaging, the 1sh-CenEPI with larger N acquires all the first group lines and then acquires the centric lines of the other half of the K-space, and thus SNR may be lost. As shown in FIG. 8*b*, this pattern was experimentally confirmed in that the tSNR of the perfusion signal decreased as the value of N increased, but still the tSNR of the 1sh-CenEPI (N=16) was much higher than that of 1sh-LinEPI. In this sense, N=4 seems to be a good balance in terms of readout duration and SNR of magnetization-prepared imaging.

The provided 1sh-CenEPI may be utilized as a new UTE readout. The 1sh-CenEPI is advantageous over existing UTE readouts such as radial or spiral trajectories in that it is implemented in Cartesian coordinates, and thus no additional interpolation or regridding is required. Simple Fourier transform is useful for real-time imaging and display as it may directly reconstruct the final 1sh-CenEPI images. In addition, important problems of existing radial and helical readouts, such as vulnerability to off-center blur, may be solved by the provided pseudo-centric EPI. Although the echo time in this study was approximately 1 ms, the echo time may be further reduced to less than tens or hundreds of microseconds by alternately combining half of the RF pulse excitation and slice-selection gradients with each other, which may increase the feasibility of the 1sh-CenEPI as a good UTE readout candidate.

The 1sh-CenEPI provided in the present disclosure may be applied to two-dimensional single-slice pCASL imaging. The combination of the provided 1sh-CenEPI and the simultaneous multislice imaging (SMS) technique will extend the application range of pCASL from single slice to whole brain, which may be another good candidate for future work.

It is confirmed that the single-shot pseudo-centric EPI (1sh-CenEPI) provided according to the present disclosure reduces the echo time to approximately 1 ms, and thus the SNR of pCASL signals is significantly improved as compared to the single-shot linear EPI (1sh-LinEPI) in the related art while showing image quality similar to that of the 2-shot centric EPI (2sh-CenEPI) in the related art. The provided approach may significantly improve the quality of magnetization-prepared imaging by reducing the echo time, and may be potentially applied to UTE imaging of Cartesian coordinates for faster image reconstruction.

Figure 9:
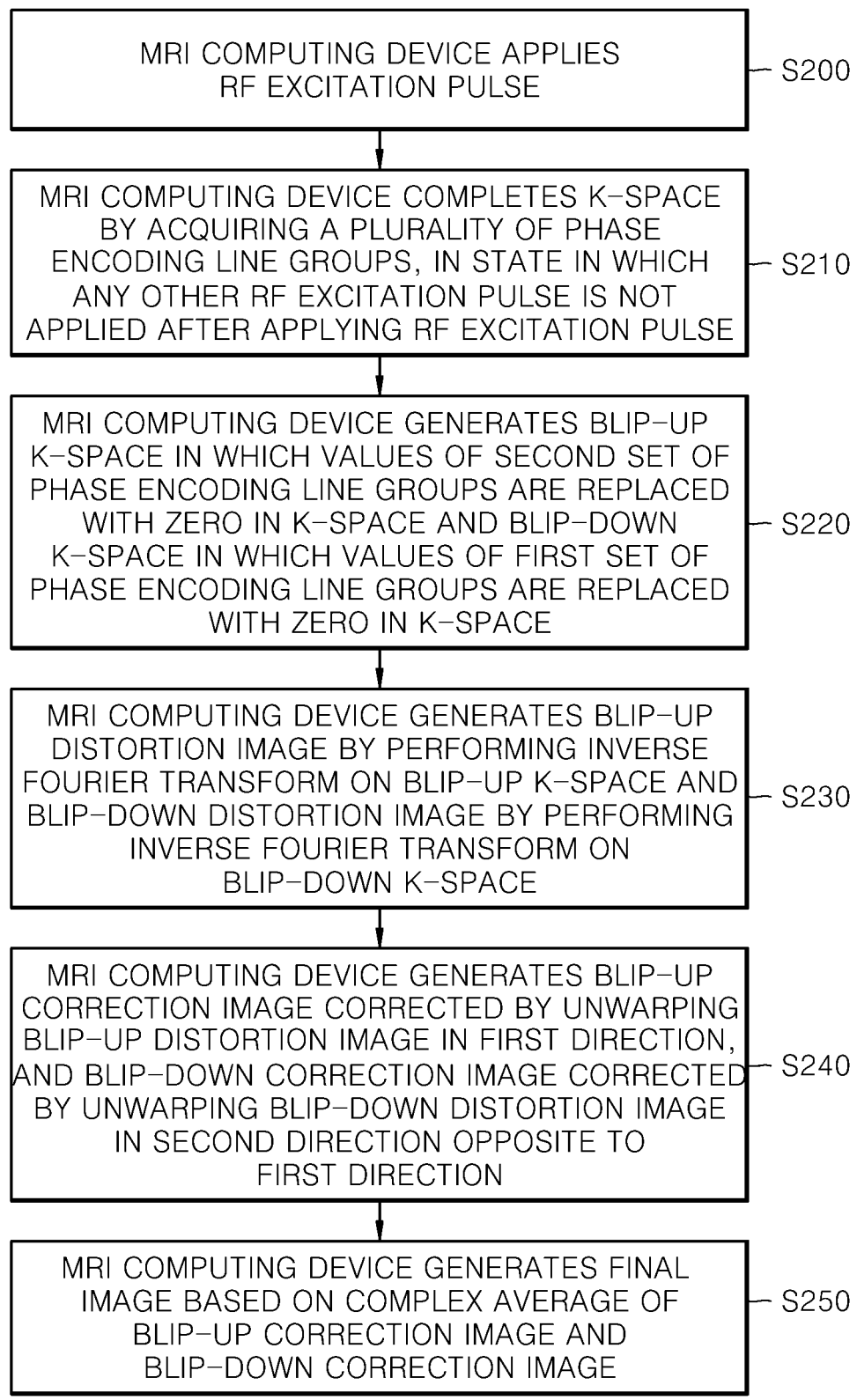
FIG. 9 is a flowchart showing steps of the method for generating MRI data described above in FIG. 2 and FIG. 3

FIG. 9 is a flowchart showing steps of the method for generating MRI data described above in FIG. 2 and FIG. 3.

In step S200, an MRI computing device may (or may cause a scanner to) apply a radio-frequency (RF) excitation pulse.

In step S210, the MRI computing device may complete a K-space by acquiring a plurality of phase encoding line groups, in a state in which any other RF excitation pulse is not applied after applying the RF excitation pulse.

In step S220, the MRI computing device may generate a blip-up K-space in which values of the second set of phase encoding line groups are replaced with zero in the K-space and a blip-down K-space in which values of the first set of phase encoding line groups are replaced with zero in the K-space.

In step S230, the MRI computing device may generate a blip-up distortion image by performing an inverse Fourier transform on the blip-up K-space and a blip-down distortion image by performing the inverse Fourier transform on the blip-down K-space.

In this case, the blip-up distortion image and the blip-down distortion image may have space distortions opposite to each other.

In step S240, the MRI computing device may generate a blip-up correction image corrected by unwarping the blip-up distortion image in a first direction, and a blip-down correction image corrected by unwarping the blip-down distortion image in a second direction opposite to the first direction.

In this case, the first direction may be a direction from an anterior part to a posterior part of a head, and the second direction may be a direction from the posterior part of the head to the anterior part.

In step S250, the MRI computing device may generate a final image based on a complex average of the blip-up correction image and the blip-down correction image.

The present disclosure may be used to do a test in phantom and human brains in 3T. In addition, the provided reordering method may be applied to pseudo-continuous arterial spin labeling (pCASL) to evaluate the efficiency of centric reordering in magnetization-prepared imaging.

According to the 1sh-CenEPI provided according to an aspect of the present disclosure, the echo time may be significantly reduced while maintaining a similar readout window and providing images similar to the existing linear and multi-shot center-out EPI images, which improves the SNR of magnetization-prepared imaging. The present disclosure may be used as a novel readout technique for various magnetization-prepared imaging techniques.

The 1sh-CenEPI provided by the present disclosure reduces the echo time from 50 ms to 1.4 ms for the gradient-echo EPI and from 100 ms to 7 ms for the spin-echo EPI, and the extension of the readout duration is less than 10% of the whole readout duration in most cases. The 1sh-CenEPI image does not show significant geometric distortion in both the phantom and human brain as compared with the existing 2-shot center-out EPI (2sh-CenEPI). In the pCASL results, 3-fold temporal SNR increase and 2-fold spatial SNR increase in perfusion-weighted images are achieved by the 1sh-CenEPI whereas cerebral blood flow (CBF) values are consistent with previous studies, as compared with the existing linear ordering.

According to the present disclosure, there may be provided a technology capable of improving the SNR of magnetization-prepared imaging by significantly reducing echo time and achieving centric reordering in single-shot EPI of Cartesian coordinates.

The single-shot pseudo-centric EPI (1sh-CenEPI) provided according to the present disclosure may reduce the echo time to approximately 1 ms, and thus the SNR of pCASL signals may be significantly improved as compared to the single-shot linear EPI (1sh-LinEPI) in the related art while showing image quality similar to that of the 2-shot centric EPI (2sh-CenEPI) in the related art. The method provided according to the present disclosure may significantly improve the quality of magnetization-prepared imaging by reducing the echo time, and may be potentially applied to UTE imaging of Cartesian coordinates for faster image reconstruction.

By using the embodiments of the present disclosure described above, those skilled in the technical field to which the present disclosure belongs could easily implement various changes and modifications without departing from the scope of the essential characteristics of the present disclosure. Features of each claim in Claims may be incorporated into other claims that do not depend on or are not depended on by the claim, within the scope that could be understood upon reading the present specification.

ACKNOWLEDGEMENT

The present invention was developed while the Korea Advanced Institute of Science and Technology (the task execution institution) was conducting a research project on the brain cognitive function based on cerebrospinal fluid circulation(Project Unique No. 2020141018, Project No. NRF-2020R1A4A1018714, Research Period 2020.07.01~2022.12.31) and while the National University Hospital (the task execution institution) was conducting a research project on advanced chemical exchange and perfusion MRI imaging techniques for diagnosing brain diseases(Project Unique No. 2020122008, Project No. NRF-2020R1A2C2008949, Research Period 2020.04.01~2020.12.31). the research projects were supported by the Ministry of Science and ICT and the National Research Foundation of Korea.

What is claimed is:

1. A method for generating magnetic resonance imaging (MRI) data, comprising:
   causing, by an MRI computing device, an MRI scanner to apply a single radio-frequency (RF) excitation pulse;
   completing, by the MRI computing device, a K-space by acquiring a plurality of phase encoding line groups through the MRI scanner, in a state in which any other RF excitation pulse is not applied after applying the RF excitation pulse;
   generating, by the MRI computing device, a blip-up K-space in which values of a second set of phase encoding line groups are replaced with predefined values in the K-space and a blip-down K-space in which values of a first set of phase encoding line groups are replaced with the predefined values in the K-space;
   generating, by the MRI computing device, a blip-up distortion image by performing an inverse Fourier transform on the blip-up K-space and a blip-down distortion image by performing the inverse Fourier transform on the blip-down K-space;
   generating, by the MRI computing device, a blip-up correction image corrected by unwarping the blip-up distortion image in a first direction, and a blip-down correction image corrected by unwarping the blip-down distortion image in a second direction opposite to the first direction; and
   generating, by the MRI computing device, a final image based on a complex average of the blip-up correction image and the blip-down correction image, wherein
   each of the plurality of phase encoding line groups includes a plurality of phase encoding lines,
   the first set of phase encoding line groups among the plurality of phase encoding line groups are acquired by a blip-up approach,
   the second set of phase encoding line groups including remaining phase encoding line groups excluding the first set of phase encoding line groups among the plurality of phase encoding line groups are acquired by a blip-down approach,
   the blip-up distortion image and the blip-down distortion image have space distortions opposite to each other, and
   both of the blip-up K-space and the blip-down K-space are generated from the K-space completed with the single radio-frequency (RF) excitation pulse.

2. An MRI computing device comprising:
   a communication interface configured to communicate with an MRI scanner; and
   a processing unit, wherein
   the processing unit is configured to transmit a command to the MRI scanner through the communication interface,
   the command is configured to cause the MRI scanner to apply a single RF excitation pulse, and complete a K-space by acquiring a plurality of phase encoding line groups from the MRI scanner through the communication interface in a state in which the MRI scanner does not apply any other RF excitation pulse after applying the RF excitation pulse,
   generate a blip-up K-space in which values of a second set of phase encoding line groups are replaced with predefined values in the K-space and a blip-down K-space in which values of a first set of phase encoding line groups are replaced with the predefined values in the K-space;
   generate a blip-up distortion image by performing an inverse Fourier transform on the blip-up K-space and a blip-down distortion image by performing the inverse Fourier transform on the blip-down K-space;
   generate a blip-up correction image corrected by unwarping the blip-up distortion image in a first direction, and a blip-down correction image corrected by unwarping the blip-down distortion image in a second direction opposite to the first direction; and
   generate a final image based on a complex average of the blip-up correction image and the blip-down correction image,
   each of the plurality of phase encoding line groups includes a plurality of phase encoding lines,
   the first set of phase encoding line groups among the plurality of phase encoding line groups are acquired by a blip-up approach,
   the second set of phase encoding line groups including remaining phase encoding line groups excluding the first set of phase encoding line groups among the plurality of phase encoding line groups are acquired by a blip-down approach, the blip-up distortion image and the blip-down distortion image have space distortions opposite to each other, and both of the blip-up K-space and the blip-down K-space are generated from the K-space completed with the single radio-frequency (RF) excitation pulse.

3. The method of claim 1, wherein the plurality of phase encoding lines included in each of the plurality of phase encoding line groups have consecutive phase encoding sizes.

4. The method of claim 1, wherein absolute values of phase encoding sizes of the plurality of phase encoding lines included in each of the plurality of phase encoding line groups have linearity with respect to time.

5. The method of claim 1, wherein a magnitude of a gradient magnetic field of a phase encoding line acquired last in a first phase encoding line group among the plurality of phase encoding line groups is discontinuous with a magnitude of a gradient magnetic field of a first acquired phase encoding line in a second phase encoding line group acquired immediately after acquiring the first phase encoding line group among the plurality of phase encoding line groups.

6. The method of claim 1, wherein a time interval between a time at which a first phase encoding line in each of the phase encoding line groups is acquired and a time at which a second phase encoding line acquired immediately after acquiring the first phase encoding line is acquired is a first time interval, a time interval between a time at which a last acquired phase encoding line is acquired in a first phase encoding line group among the plurality of phase encoding line groups and a time at which a first acquired phase encoding line is acquired in a second phase encoding line group acquired immediately after acquiring the first phase encoding line group among the plurality of phase encoding line groups is a second time interval, and the second time interval is greater than the first time interval.

7. The method of claim 1, wherein, among the plurality of phase encoding line groups, an absolute value of an average phase encoding size of a phase encoding line group acquired earlier is not greater than an absolute value of an average phase encoding size of a phase encoding line group acquired later.

8. The method of claim 1, wherein an average phase encoding size of each phase encoding line group of the first set of phase encoding line groups has a positive value, and an average phase encoding size of each phase encoding line group of the second set of phase encoding line groups has a negative value.

9. The method of claim 1, the first direction is a direction from an anterior part to a posterior part of a head, and the second direction is a direction from the posterior part of the head to the anterior part.

10. The MRI computing device of claim 2, wherein absolute values of phase encoding sizes of the plurality of phase encoding lines included in each of the plurality of phase encoding line groups have linearity with respect to time.

11. The MRI computing device of claim 2, wherein a magnitude of a gradient magnetic field of a phase encoding line acquired last in a first phase encoding line group among the plurality of phase encoding line groups is discontinuous with a magnitude of a gradient magnetic field of a first acquired phase encoding line in a second phase encoding line group acquired immediately after acquiring the first phase encoding line group among the plurality of phase encoding line groups.

12. The MRI computing device of claim 2, an average phase encoding size of each phase encoding line group of the first set of phase encoding line groups has a positive value, and an average phase encoding size of each phase encoding line group of the second set of phase encoding line groups has a negative value.

13. The MRI computing device of claim 12, wherein among the plurality of phase encoding line groups, an absolute value of an average phase encoding size of a phase encoding line group acquired earlier is not greater than an absolute value of an average phase encoding size of a phase encoding line group acquired later.

* * * * *